(12) United States Patent
Fujisawa et al.

(10) Patent No.: US 8,557,392 B2
(45) Date of Patent: Oct. 15, 2013

(54) FLEXIBLE COPPER CLAD LAMINATE

(75) Inventors: Satoshi Fujisawa, Tokyo (JP); Yuji Suzuki, Tokyo (JP); Takeo Uno, Tokyo (JP); Koichi Hattori, Chiba (JP); Naoya Kuwasaki, Fukuoka (JP)

(73) Assignees: Furukawa Electric Co., Ltd., Tokyo (JP); Nippon Steel & Sumikin Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/055,375

(22) PCT Filed: Jul. 22, 2009

(86) PCT No.: PCT/JP2009/063094
§ 371 (c)(1),
(2), (4) Date: Apr. 21, 2011

(87) PCT Pub. No.: WO2010/010892
PCT Pub. Date: Jan. 28, 2010

(65) Prior Publication Data
US 2011/0189501 A1    Aug. 4, 2011

(30) Foreign Application Priority Data
Jul. 22, 2008 (JP) ................. 2008-188742

(51) Int. Cl.
*B32B 15/08* (2006.01)
*H05K 1/09* (2006.01)
(52) U.S. Cl.
USPC ........... 428/458; 428/606; 428/607; 428/612; 428/674; 428/675; 428/680; 428/447; 428/448; 428/450; 174/258; 174/259
(58) Field of Classification Search
USPC ......... 428/607, 621, 626, 675, 458, 606, 612, 428/674, 680, 447, 448, 450; 174/258–259
See application file for complete search history.

(56) References Cited

U.S. PATENT DOCUMENTS

| | | | |
|---|---|---|---|
| 6,379,784 B1 | 4/2002 | Yamamoto et al. | |
| 7,691,487 B2 * | 4/2010 | Nagatani | 428/607 |
| 2007/0237976 A1 | 10/2007 | Okada et al. | |

FOREIGN PATENT DOCUMENTS

| | | |
|---|---|---|
| EP | 0 533 198 A2 | 3/1993 |
| JP | 8 281866 | 10/1996 |
| JP | 10 75053 | 3/1998 |
| JP | 11 256389 | 9/1999 |
| JP | 2000 269637 | 9/2000 |
| JP | 2001 205734 | 7/2001 |
| WO | 2004 005588 | 1/2004 |

OTHER PUBLICATIONS

U.S. Appl. No. 13/055,353, filed Feb. 21, 2011, Fujisawa, et al.
U.S. Appl. No. 13/574,478, filed Jul. 20, 2012, Fujisawa, et al.
Extended Search Report issued Nov. 29, 2012 in European Patent Application No. 09800406.2.-1232.

* cited by examiner

*Primary Examiner* — Cathy Lam
(74) *Attorney, Agent, or Firm* — Oblon, Spivak, McClelland, Maier & Neustadt, L.L.P.

(57) ABSTRACT

In order to provide a flexible laminate circuit board using a surface treated copper foil satisfying all of a bonding strength of a copper foil with respect to polyimide, acid resistance, and etching property, in a flexible laminate circuit board formed by a copper foil on the surface of a polyimide resin layer, the copper foil is a surface treated copper foil formed by depositing an Ni—Zn alloy onto at least one surface of a untreated copper foil, and the Zn deposition amount in the deposited Ni—Zn alloy is 6% or more and 15% or less of the (Ni deposition amount+Zn deposition amount), and the Zn deposition amount is 0.08 mg/dm$^2$ or more to provide a flexible copper clad laminate.

5 Claims, No Drawings

FLEXIBLE COPPER CLAD LAMINATE

TECHNICAL FIELD

The present invention relates to a flexible copper clad laminate (hereinafter sometimes described as "CCL") comprised of a polyimide resin layer and a surface-treated copper foil.

BACKGROUND ART

In a flexible copper clad laminate use copper foil, when bonding the copper foil to a resin substrate, it is necessary to improve its bonding strength and satisfy required electrical property, etching property, heat resistance, and chemical resistance as a copper clad laminate. For this reason, roughening treatment is applied to the bonding surface of the copper foil to be bonded with the resin layer after the foil is produced (hereinafter sometimes described as the "untreated copper foil"), further zinc (Zn) plating, nickel (Ni) plating, or the like is applied to the top of the roughened surface, still further chromate treatment etc. are applied to the top of the surface plated with the Zn, plated with the Ni, and a variety of other techniques are applied.

Recently, IC mounted boards driving liquid crystal displays of display parts of PCs, mobile phones, and PDAs are becoming increasingly advanced in density. Stability with respect to treatment at a high temperature in the production processes of the same and accurate circuit configurations are demanded. On such demands, in flexible copper clad laminates for producing printed circuit boards, copper clad laminates manufactured by bonding electrodeposited copper foil capable of forming accurate conductive circuits, and polyimide resin layers capable of being used at a high temperature, by thermal adhesion at high temperature of several hundreds of degrees, etc. have been employed.

In this high temperature manufacturing treatment, improvement of the bonding strength of the copper foil with the polyimide resin layer has become the most pressing issue. As a means for solving this problem, the technique of roughening treatment of the surface of the copper foil by a Zn-containing alloy is disclosed in for example Patent Literature 1.

Further, as the flexible copper clad laminate using copper foil bonded with a polyimide resin layer at a high temperature, a surface-treated copper foil obtained by treating the surface of untreated copper foil for bonding with a polyimide resin layer by an electroplating solution containing at least one element selected from among molybdenum, iron, cobalt, nickel, and tungsten and further providing an Ni plating layer or Zn plating layer or else an Ni plating layer plus a Zn plating layer on this plating layer has been proposed (see Patent Literature 2).

CITATION LIST

Patent Literature

Patent Literature 1: Japanese Patent Publication (A) No. 2000-269637
Patent Literature 2: Japanese Patent Publication (A) No. 11-256389

DISCLOSURE OF THE INVENTION

Problem to be Solved by the Invention

The roughened layer including a Zn layer disclosed in the above patent literature has an advantageous effect in the point that the bonding strength between the copper foil and the polyimide resin layer at a high temperature is improved. However, if forming a conductive circuit by etching treatment by an acidic solution after bonding the copper foil to the polyimide resin layer, even the Zn layer which bonds the copper foil and the polyimide resin layer begins to dissolve since zinc is easily dissolved by acid, so there is apprehension that the bonding strength between the copper foil and the polyimide resin layer after forming the circuit will sharply fall and accidents of the conductive circuit peeling off from the polyimide resin layer during use of the circuit board will occur. In order to prevent such accidents, it was necessary to shorten the etching time and keep the dissolution and flow-out of the Zn layer to the lowest limit, therefore advanced technology and management systems were needed for the etching treatment, so there were the disadvantages that the productivity of the printed circuit boards was reduced and costs became higher.

In this way, with the roughening treatment of copper foil disclosed in the above patent literature, as described above, the bonding strength with respect to the polyimide resin layer, acid resistance, and etching property could not be all satisfied. Therefore, a flexible copper clad laminate satisfying all of the bonding strength, acid resistance, and etching property has never been proposed.

An object of the present invention is to provide a flexible copper clad laminate using surface-treated copper foil satisfying all of the bonding strength with respect to the polyimide resin layer, acid resistance, and etching property.

Means for Solving the Problem

The present invention, as the result of intensive studies on the blending ratio of nickel and zinc in the surface treatment of the original copper foil, keeps the content of zinc with respect to nickel within a constant range to thereby obtain a satisfactory initial peel strength with respect to the polyimide resin layer and obtains a good retention rate of the initial peel strength after heat treatment and bonds the surface-treated copper foil subjected to the above surface treatment to a polyimide resin layer to thereby succeed in development of a heat resistant polyimide flexible laminate board.

A flexible copper clad laminate of the present invention is a flexible copper clad laminate having a copper foil on one surface or both surfaces of a polyimide resin layer, wherein the copper foil has a surface-treated layer containing a Ni—Zn alloy on the surface of the original copper foil (untreated copper foil) contacting the polyimide resin, the ratio of the amount of Zn with respect to the total of Ni and Zn in the surface-treated layer is 6% or more and 15% or less, and the amount of Zn is 0.08 mg/dm$^2$ or more.

Preferably, the amount of Ni in the surface-treated layer of the copper foil is 0.45 to 3 mg/dm$^2$.

Preferably, the outermost layer of the surface-treated copper foil is a silane coupling treated layer treated by at least one amine-based silane coupling agent selected from N-2(aminoethyl)-3-aminopropylmethyldimethoxysilane, N-2(aminoethyl)-3-aminopropyltrimethoxysilane, N-2(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propylamine, N-phenyl-3-aminopropyltrimethoxysilane, N-phenyl-3-aminopropyltrimethoxysilane, and N-(vinylbenzyl)-2-aminoethyl-3-aminopropyltrimethoxysilane, and the surface roughness (Rz) of the copper foil is 0.5 to 0.9 μm.

Preferably, the polyimide resin layer is comprised of two or more layers, at least one layer of polyimide resin layer is a thermoplastic polyimide resin layer having a glass transition temperature of 200 to 330° C., and the thickness of the thermoplastic polyimide resin layer is 1.2 to 2.5 times the surface roughness (Rz) of the copper foil.

Preferably, the initial peel strength of the bonding surface of the copper foil with the polyimide resin layer in the flexible copper clad laminate is 0.6 kN/m or more, and the peel strength after an open-air heat test is 80% or more of the initial peel strength.

Effect of the Invention

The present invention can provide a laminated circuit board satisfying all of the bonding strength, acid resistance, and etching property by using surface-treated copper foil satisfying all of the bonding strength with the polyimide resin layer, acid resistance, and etching property.

BEST MODE FOR CARRYING OUT THE INVENTION

The polyimide forming the polyimide resin layer is generally represented by the following general formula (1) and can be produced by a known method of using a diamine ingredient and an acid dianhydride ingredient in substantially equal moles and polymerizing those in an organic polar solvent.

[Chemical Formula 1]

Formula (1)

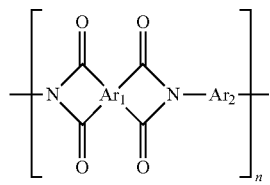

Here, $Ar_1$ is a tetravalent organic group having at least one aromatic ring, and $Ar_2$ is a bivalent organic group having at least one aromatic ring. Namely, $Ar_1$ is a residue of an acid dianhydride, and $Ar_2$ is a residue of diamine.

As the acid dianhydride, for example, an aromatic tetracarboxylic acid dianhydride represented by $O(CO)_2$—$Ar_1$—$(CO)_2O$ is preferred. Ones giving the following aromatic acid anhydride residues as $Ar_1$ may be illustrated.

[Chemical Formula 2]

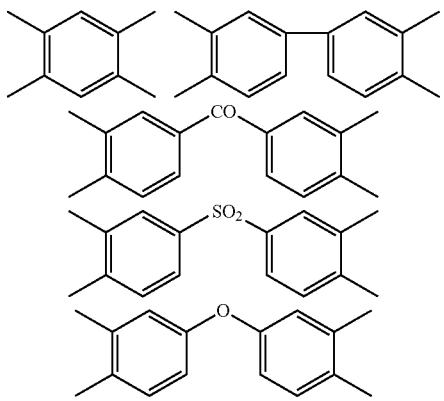

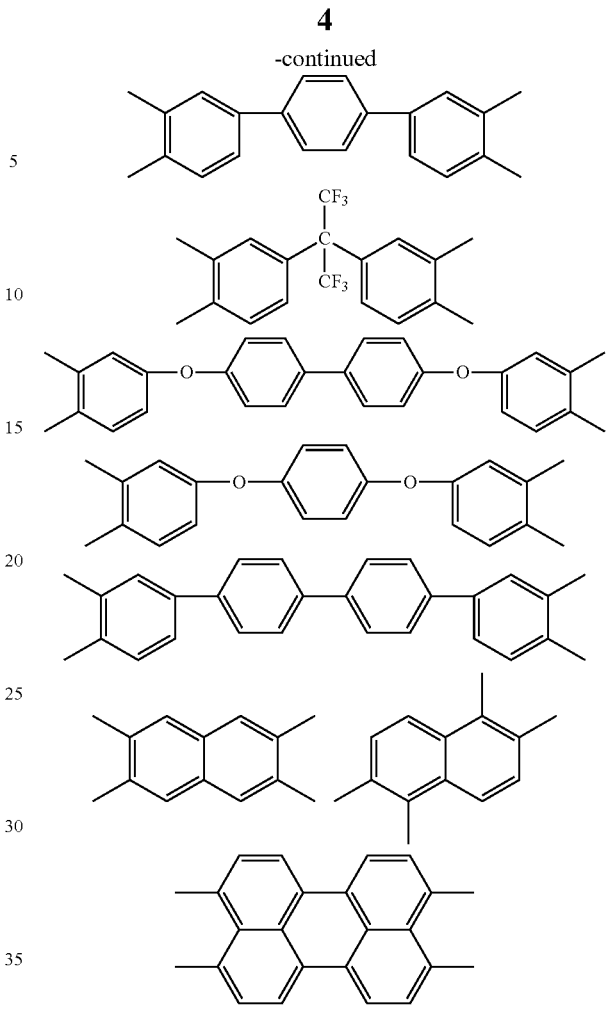

The acid dianhydride can be used alone or in a mixture of two or more types. Among these, preferably use is made of one selected from among pyromellitic acid dianhydride (PMDA), 3,3',4,4'-biphenyltetracarboxylic acid dianhydride (BPDA), 3,3',4,4'-benzophenonetetracarboxylic acid dianhydride (BTDA), 3,3',4,4'-diphenylsulfonetetracarboxylic acid dianhydride (DSDA), and 4,4'-oxydiphthalic acid dianhydride (ODPA).

As the diamine, for example, an aromatic diamine represented by $H_2N$—$Ar_2$—$NH_2$ is preferred. Aromatic diamines giving the following aromatic diamine residues as $Ar_2$ may be illustrated.

[Chemical Formula 3]

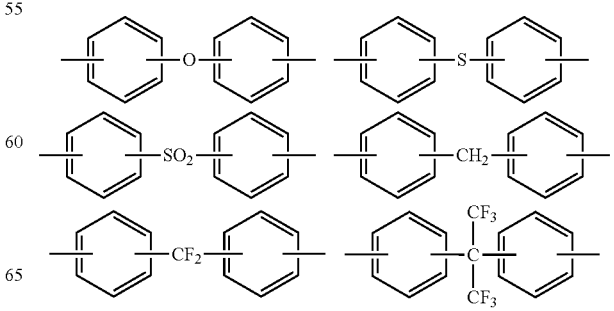

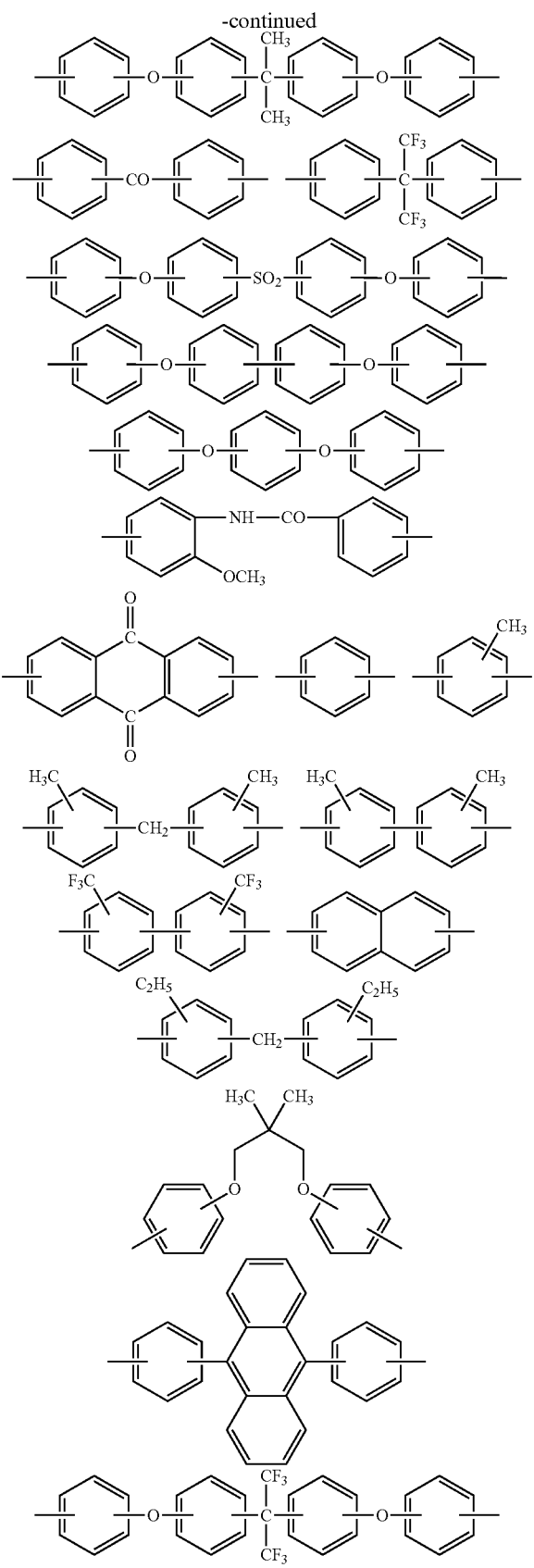

Among these diamines, the preferably illustrated ones are diaminodiphenylether (DAPE), 2'-methoxy-4,4'-diaminobenzanilide (MABA), 2,2'-dimethyl-4,4'-diaminobiphenyl (m-TB), p-phenylenediamine (P-PDA), 1,3-bis(4-aminophenoxy)benzene (TPE-R), 1,3-bis(3-aminophenoxy)benzene (APB), 1,4-bis(4-aminophenoxy)benzene (TPE-Q), and 2,2-bis[4-(4-aminophenoxy)phenyl]propane (BAPP).

For the solvent used in the polymerization, there can be mentioned, for example, dimethylacetoamide, n-methylpyrrolidinone, 2-butanone, diglyme, and xylene. One or two or more of them may be used together as well. Further, the resin viscosity of the polyamide acid (polyimide precursor) obtained by polymerization is preferably controlled to within a range of 500 cps to 35000 cps.

The polyimide resin layer of the flexible copper clad laminate of the present invention may be comprised of a single layer or a plurality of layers. However, in order to make the dimensional stability of the flexible copper clad laminate and the bonding strength with the copper foil excellent, it is preferably comprised of a plurality of layers.

When the polyimide resin layer is comprised of a plurality of layers, preferably a resin layer having a low coefficient of thermal expansion of a coefficient of thermal expansion (CTE) of $30 \times 10^{-6}$ [1/K] or less, preferably within a range of $1 \times 10^{6}$ to $30 \times 10^{-6}$ [1/K], is used as the principal polyimide resin layer (1), and a polyimide resin layer (2) having a glass transition temperature of 330° C. or less is provided on one surface or both surfaces of that.

As the polyimide resin layer (2), preferably use is made of a layer having a coefficient of thermal expansion (CTE) exceeding $30 \times 10^{-6}$ [1/K] and having a glass transition temperature of not more than 330° C. More preferably, the polyimide resin layer (2) is one having a coefficient of thermal expansion of $30 \times 10^{-6}$ [1/K] to $60 \times 10^{-6}$ [1/K] and having a glass transition temperature within a range of 200 to 330° C.

If the CTE of the polyimide resin layer (1) is larger than $30 \times 10^{-6}$ [1/K], curling is liable to become serious when forming the copper clad laminate. Further, the dimensional stability is lowered, so it is not preferred for the product. The thickness of the polyimide resin layer (1) should be 50% or more of the thickness of the entire polyimide resin layer, preferably 70 to 95%.

The thickness of the polyimide resin layer (2) is preferably within a range of 1.2 to 2.5 times the surface roughness (Rz) of the copper foil. If the thickness of the polyimide resin layer (2) is smaller than 1.2 times of Rz, the filling property of the polyimide resin layer into the copper foil is insufficient, therefore good adhesion and reliability are not obtained. Further, if the thickness of the polyimide resin layer (2) is larger than 2.5 times of Rz, cohesive failure in the polyimide resin layer occurs and the adhesion falls, so this is not preferred.

The method of forming the polyimide resin layer is not particularly limited. However, for example, preferably a resin solution of a precursor of polyimide, that is, polyamide acid, is directly coated on the surface of the later explained surface-treated copper foil, the solvent contained in the resin solution is removed to a certain extent at a temperature not more than 150° C., then heat treatment is carried out for about 5 to 40 minutes at a temperature within a range of 100 to 450° C., preferably 300 to 450° C., to dry off the solvent and imidize the resin. When providing the polyimide resin layer in two or more layers, it is possible to coat and dry the resin solution of the first polyamide acid, then coat and dry the resin solution of the second polyamide acid, then similarly sequentially coat and dry the resin solutions of third and following polyamide acids, then heat treat these together for about 5 to 40 minutes at a temperature within a range of 300 to 450° C. for imidization. If the temperature of heat treatment is lower than 100° C., the dehydration ring closure reaction of polyimide does not sufficiently advance. Conversely, if it exceeds 450° C., the polyimide resin layer and copper foil are liable to be degraded due to oxidation etc.

The thickness of the polyimide resin layer should be within a range of 6 to 60 μm, preferably within a range of 9 to 40 μm. If the thickness of an insulating layer does not reach 6 μm, wrinkles are liable to occur at the time of conveyance in the production of the copper clad laminate etc. Conversely, if it exceeds 60 μm, problems in dimensional stability, bending property, etc. are liable to occur at the time of manufacture of the copper clad laminate. Note that, when forming the polyimide resin layer in a plurality of layers, the thickness of the total of those should be controlled to within the range described above.

The flexible copper clad laminate of the present invention may be naturally a single-sided copper clad laminate providing a copper foil on only one surface of the polyimide resin layer or may be a double-sided copper clad laminate providing copper foils on both surfaces of the polyimide resin layer. Note that, a double-sided copper clad laminate can be obtained by forming two single sided copper clad laminates, then making the polyimide resin layers face each other and press-bonding them by a hot press, by hot bonding copper foil onto the polyimide resin layer of a single-sided copper clad laminate, and so on.

The copper foil to be subjected to surface treatment (untreated copper foil) in the present invention may be either electrodeposited copper foil or rolled copper foil. Note that, when there is no necessity of particularly differentiating these, these will be sometimes simply be expressed as "copper foil" or "untreated copper foil". The thickness of the untreated copper foil is preferably 5 μm to 35 μm. If the thickness of the copper foil is less than 5 μm, for example wrinkles are formed at the time of the production, therefore the production of thin copper foil becomes expensive to be produced and is not practical.

Further, if the foil thickness is greater than 35 μm, this is out of the specifications for thinner and smaller sized IC mounted boards for driving liquid crystal displays of display parts of PCs, mobile phones, and PDAs, so this is not preferred.

As the untreated copper foil surface in the present invention, a surface roughness Rz from 0.1 μm to 1.0 μm or Ra of 0.15 μm or less is preferred.

Further, for improvement of the peel strength and chemical resistance, it is effective to perform roughening treatment. However, when considering bending property etc., roughening controlling the Rz to 1.5 μm or less is preferred.

In the present invention, surface treatment using mainly a binary alloy layer of nickel (Ni)-zinc (Zn) is applied to the above untreated copper foil surface or to roughening treated surface after the untreated copper foil surface is roughening treated.

The reason for including Ni in the surface treated layer applied to the surface of the copper foil is prevention of diffusion of the copper from the copper foil into the surface treated layer. The amount of deposition of Ni is preferably 0.45 mg/dm$^2$ to 3 mg/dm$^2$. If the amount of deposition of Ni exceeds 3 mg/dm$^2$, in the case that etching is carried out so as not to leave behind any residue, the treatment time becomes long, therefore the problem of the circuit being shaped in a trapezoidal shape sometimes occurs, so this is not preferred. If the amount of Ni deposition does not reach 0.45 mg/dm$^2$, diffusion of copper from the copper foil easily occurs, therefore a peel strength after open-air heating of 90% or more of the initial peel strength can no longer be maintained, so this is not preferred. When considering etching etc., the Ni deposition amount is more preferably 0.5 mg/dm$^2$ to 1.0 mg/dm$^2$.

The reason for including Zn in the surface-treated layer applied to the surface of the copper foil is improvement of the bonding strength with respect to the resin substrate (particularly the polyimide resin layer) and prevention of deterioration of the bonding strength due to heat at the bonding.

The deposition amount of Zn is 0.08 mg/dm$^2$ or more, while the content (wt %) of Zn is 6% or more and 15% or less with respect to (Ni deposition amount+Zn deposition amount). This is because unless the content of Zn is 6% or more and the deposition is 0.08 mg/dm$^2$ or more, the heat resistance is poor, while if the content is 15% or more, the acid resistance becomes poor.

As the surface treatment for the untreated copper foil surface mainly using the Ni—Zn binary alloy layer, more preferably alloy plating using an inorganic plating solution is applied.

Note that, the surface treatment using mainly an Ni—Zn binary alloy layer can be applied to the surface of the untreated copper foil by a pyrophosphoric acid bath as well. However, surface treatment by a pyrophosphoric acid bath sometimes has some problems in chemical resistance. Therefore, in the present invention, the surface treatment is applied to the untreated copper foil by an inorganic plating bath.

As the plating solution for applying the Ni—Zn binary alloy to the surface of the untreated copper foil, a plating bath containing sulfate is particularly preferred. The blending composition of that is as follows.

Nickel sulfate is included so that the nickel concentration becomes 0.1 g/L to 200 g/L, preferably 20 g/L to 60 g/L, zinc sulfate is included so that the zinc concentration becomes 0.01 g/L to 100 g/L, preferably 0.05 g/L to 5.0 g/L, and boric acid is included in an amount of 1 to 100 g/L, preferably 5 to 40 g/L, to obtain the plating solution.

The plating conditions are made a solution temperature of 20 to 60° C., a pH of 2 to 7, and a current density of 0.3 to 10 A/dm$^2$.

The Ni—Zn alloy layer is formed on the surface of the untreated copper foil in an inorganic plating bath by electroplating treatment. After the above surface treatment, Cr metal, Cr hydrate or oxide, or an organic coating film is applied to the surface of that. The deposition amount of Cr is preferably 0.01 mg/dm$^2$ or more and 0.3 mg/dm$^2$ or less. If the Cr deposition amount is large, etching becomes difficult, so this not preferred. Further, if the Cr deposition amount is small, problems arise in terms of rust prevention, therefore 0.01 mg/dm$^2$ or less is not preferred. Further, as the organic coating film, the above silane coupling agent is applied to form a coating film.

EXAMPLES

The present invention will be explained below based on examples.

Note that, in the examples, the measurement of the amount of nickel and amount of zinc of the surface of the copper foil contacting the polyimide resin layer, the measurement of the glass transition temperature and coefficient of thermal expansion of the polyimide resin layer, the measurement of the peel strength of the copper foil with the polyimide resin layer, and other measurements were carried out as follows.

[Measurement of Nickel Amount and Zinc Amount]

Copper foils subjected to the surface treatment were analyzed by fluorescent X-rays, and the amounts of those were found.

[Measurement of Glass Transition Temperature]

Using a viscoelastic analyzer (RSA-II made by Rheometric Scientific F.E. Ltd.) and using 10 mm width samples, the temperature was found from the maximum value of the loss tangent (Tan δ) when elevating the temperature from room temperature up to 400° C. at a rate of 10° C./min while giving vibration of 1 Hz.

[Measurement of Coefficient of Thermal Expansion]

The temperature was raised up to 250° C. by using a thermo-mechanical analyzer (made by Seiko Instruments Inc.), the samples were further held at that temperature for 10 minutes and then cooled at a rate of 5° C./min, and a mean coefficient of thermal expansion from 240° C. to 100° C. was found.

[Measurement of Peel Strength]

In the copper clad laminates, the peel strength was found by using a Tensilon Tester (made by Toyo Seiki Seisaku-sho Ltd.), fixing the resin side of a 1 mm width copper clad sample to a stainless steel plate by a two-sided tape, and peeling off the copper in a direction of 90 degrees at a rate of 50 mm/min. Further, a heat resistance test holding samples measured for bonding strength as described above at 150° C. for 168 hours under an air atmosphere was carried out. The bonding strengths after this heat resistance test and the previously found bonding strengths were compared to thereby measure the retention rate.

[Measurement of Acid Resistance]

Test pieces after bonding with polyimide were dipped in a hydrochloric acid solution of water:hydrochloric acid=1:1 at ordinary temperature for 1 hour, then the peel strengths after that were measured.

Synthesis Example 1

A reaction vessel provided with a thermocouple and a stirrer and capable of introduction of nitrogen was charged with N,N-dimethylacetoamide (DMAc). In this reaction vessel, 2,2-bis[4-(4-aminophenoxy)phenyl]propane (BAPP) was added and dissolved while stirring in the vessel. Next, pyromellitic acid dianhydride (PMDA) was added in an equimolar amount as the diamine ingredient, and stirring was continued for about 3 hours after that to cause a polymerization reaction, whereby a resin solution of a polyamide acid "a" having a solid concentration of 15 wt % and a solution viscosity of 3000 cps was obtained. A polyimide film was prepared by using the polyamide acid "a", and the glass transition temperature was measured. As a result, the temperature was 280° C., and the coefficient of thermal expansion measured was $55 \times 10^{-6}$ [1/K].

Synthesis Example 2

A reaction vessel provided with a thermocouple and a stirrer and capable of introduction of nitrogen was charged with DMAc. This reaction vessel was charged with 2'-methoxy-4,4'-diaminobenzanilide (MABA) and 4,4'-diaminodiphenylether (DAPE) in a 55:45 molar ratio, then these were dissolved while stirring. Next, pyromellitic acid dianhydride (PMDA) was added in an equimolar amount with the diamine ingredient, and stirring was continued for about 3 hours after that to cause a polymerization reaction, whereby a resin solution of a polyamide acid "b" having a solid concentration of 15 wt % and a solution viscosity of 20000 cps was obtained. A polyimide film was prepared by using the polyamide acid "b", and the coefficient of thermal expansion was measured. As a result, it was $13 \times 10^{-6}$ [1/K].

Example 1

A surface-treated layer comprised of Ni—Zn and a chromate-treated layer were formed on the surface of an electrodeposited copper foil (untreated copper foil) having a surface roughness (Rz) of 0.6 μm, and a 3-aminopropyltrimethoxysilane-treated layer was formed. The amount of nickel of the surface of the copper foil at that time was 0.6 mg/dm$^2$, while the amount of zinc was 0.09 mg/dm$^2$. On this copper foil, a thermoplastic polyimide layer was formed with a thickness of about 1.5 times the roughness of the copper foil (1.0 μm) by using the polyamide acid "a" produced in above Synthesis Example 1, a low thermal expansion resin layer (14.5 μm) was formed on that using the polyamide acid "b" produced in above Synthesis Example 2, and further a thermoplastic polyimide layer (1.5 μm) was formed on that using the above polyamide acid "a", whereby a flexible single-sided copper clad laminate was obtained.

The peel strength of the obtained copper clad laminate was 0.8 kN/m, the peel strength retention rate (rate relative to the initial peel strength) at 150° C. after 168 h was 95%, and the peel strength after the acid resistance test was 0.8 kN/m.

Examples 2, 3, and 4

A flexible single-sided copper clad laminate was obtained by the same method as that in Example 1 except for use of a surface-treated copper foil obtained by forming a surface-treated layer comprised of Ni—Zn having a deposition amount shown in Table 1 and a chromate treated layer on the surface of an electrodeposited copper foil (untreated copper foil) having a surface roughness (Rz) of 0.6 μm. The peel strength of the obtained copper clad laminate, the peel strength retention rate at 150° C. after 168 h, and the peel strength after the acid resistance test are described in Table 1 together.

Examples 5 and 6

A flexible single-sided copper clad laminate was obtained by the same method as that in Example 1 except for use of a surface-treated copper foil obtained by forming a surface-treated layer comprised of Ni—Zn having a deposition amount shown in Table 1 and a chromate treated layer on the surface of electrodeposited copper foil (untreated copper foil) having a surface roughness (Rz) of 0.6 μm and changing the thickness of the thermoplastic polyimide layer relative to the surface roughness of the copper foil to the thickness shown in Table 1. The peel strength of the obtained copper clad laminate, the peel strength retention rate at 150° C. after 168 h, and the peel strength after the acid resistance test are described in Table 1 together.

Examples 7, 8, and 9

A flexible single-sided copper clad laminate was obtained by the same method as that in Example 1 except for use of a surface treated copper foil obtained by forming a surface treated layer comprised of Ni—Zn having a deposition amount shown in Table 1 and a chromate treated layer on the surface of electrodeposited copper foil (untreated copper foil) having a surface roughness (Rz) of 0.6 μm and changing the thickness of the thermoplastic polyimide layer relative to the surface roughness of the copper foil to the thickness shown in Table 1. The peel strength of the obtained copper clad laminate, the peel strength retention rate at 150° C. after 168 h, and the peel strength after the acid resistance test are described in Table 1 together.

Examples 10 and 11

A flexible single-sided copper clad laminate was obtained by the same method as that in Example 1 except for use of a surface-treated copper foil obtained by forming a surface-treated layer comprised of Ni—Zn having a deposition amount shown in Table 1 and a chromate-treated layer on the surface of an electrodeposited copper foil (untreated copper foil) having a surface roughness (Rz) of 0.6 μm. The peel strength of the obtained copper clad laminate, the peel strength retention rate at 150° C. after 168 h, and the peel strength after the acid resistance test are described in Table 1 together.

Comparative Examples 1 to 4

A flexible single-sided copper clad laminate was obtained by the same method as that in Example 1 except for use of a surface treated copper foil obtained by forming a surface treated layer comprised of Ni—Zn having a deposition amount shown in Table 1 and a chromate-treated layer on the surface of an electrodeposited copper foil (untreated copper foil) having a surface roughness (Rz) of 0.6 μm. The peel strength of the obtained copper clad laminate, the peel strength retention rate at 150° C. after 168 h, and the peel strength after the acid resistance test are described in Table 1 together.

As explained above, the present invention can provide a flexible copper clad laminate satisfying all of the bonding strength, acid resistance, and etching property by using a surface treated copper foil satisfying all of the bonding strength with the polyimide resin layer, acid resistance, and etching property.

The invention claimed is:

1. A flexible copper clad laminate comprising a copper foil on at least one surface of a polyimide resin laminate,
   wherein the copper foil has a surface-treated layer containing an Ni—Zn alloy on the at least one surface of an original copper foil (untreated copper foil) contacting the polyimide resin laminate, the ratio of the amount of Zn with respect to the total of Ni and Zn in the surface-treated layer is 6 wt % or more and 15 wt % or less, and the amount of Ni is 0.45 to 3 mg/dm$^2$ and the amount of Zn is 0.08 mg/dm$^2$ or more,
   wherein the polyimide resin laminate comprises a polyimide resin layer having a coefficient of linear thermal expansion of $1\times10^{-6}$[1/K] or more and $30\times10^{-6}$[1/K] or less, and a thermoplastic polyimide resin layer having a

TABLE 1

| | CONDITIONS | | | | | | |
|---|---|---|---|---|---|---|---|
| | Zn/(Ni + Zn) × 100 % | Ni AMOUNT mg/dm$^2$ | Zn AMOUNT mg/dm$^2$ | RESIN THICKNESS RATIO — | INITIAL PEEL STRENGTH kN/m | PEEL STRENGTH RETENTION RATE % | PEEL STRENGTH AFTER ACID RESISTANCE kN/m |
| EXAMPLE1 | 13 | 0.60 | 0.09 | 1.5 | 0.8 | 95 | 0.8 |
| EXAMPLE2 | 7 | 1.25 | 0.09 | 1.5 | 1.1 | 85 | 1.1 |
| EXAMPLE3 | 14 | 0.80 | 0.13 | 1.5 | 0.9 | 100 | 0.8 |
| EXAMPLE4 | 8 | 1.00 | 0.09 | 1.5 | 1.0 | 85 | 1.1 |
| EXAMPLE5 | 13 | 0.60 | 0.09 | 1.2 | 0.8 | 90 | 0.8 |
| EXAMPLE6 | 13 | 0.60 | 0.09 | 2.5 | 0.9 | 95 | 0.9 |
| EXAMPLE7 | 13 | 0.62 | 0.09 | 1.5 | 0.8 | 95 | 0.8 |
| EXAMPLE8 | 13 | 0.62 | 0.09 | 1.2 | 0.8 | 90 | 0.8 |
| EXAMPLE9 | 13 | 0.62 | 0.09 | 2.5 | 0.9 | 95 | 0.9 |
| EXAMPLE10 | 15 | 2.86 | 0.49 | 1.5 | 0.9 | 100 | 0.8 |
| EXAMPLE11 | 6 | 2.86 | 0.19 | 1.5 | 1.3 | 85 | 1.3 |
| COMPARATIVE EXAMPLE1 | 10 | 0.65 | 0.07 | 1.5 | 0.8 | 60 | 0.8 |
| COMPARATIVE EXAMPLE2 | 17 | 0.70 | 0.14 | 1.5 | 0.6 | 100 | 0.4 |
| COMPARATIVE EXAMPLE3 | 6 | 1.20 | 0.07 | 1.5 | 1.1 | 60 | 1.1 |
| COMPARATIVE EXAMPLE4 | 21 | 0.30 | 0.08 | 1.5 | 0.6 | 100 | 0.3 |

As apparent from Table 1, in each example, the Zn deposition amount in the Ni—Zn alloy obtained by deposition onto the untreated copper foil is 6% or more and 15% or less of the (Ni deposition amount+Zn deposition amount), the Zn deposition amount is 0.08 mg/dm$^2$ or more, and the thicknesses of resin is within a range of 1.2 to 2.5 times the surface roughness of the copper foil, therefore the peel strength, retention rate of the peel strength after heating, and acid resistance are excellent.

Compared with these examples, in comparative examples 1 and 3, the deposition amounts of Zn were small, therefore the initial peel strengths were satisfactory, but the peel strength retention rates were lowered, so these could not satisfy the quality required as a final product. Further, in comparative examples 2 and 4, the deposition ratios of Zn were large, therefore the retention rates of the peel strength were satisfactory, but the peel strengths after the acid resistance test became less than 0.6 kN/m, so both of these were not satisfactory as products.

coefficient of linear thermal expansion of exceeding $30\times10^{-6}$[1/K] and $60\times10^{-6}$[1/K] or less, and
wherein the thermoplastic polyimide resin layer is bonded to the copper foil.

2. A flexible copper clad laminate as set forth in claim 1, wherein a silane coupling treated layer treated by at least one amine-based silane coupling agent selected from N-2(aminoethyl)-3-aminopropylmethyldimethoxysilane, N-2(aminoethyl)-3-aminopropyltrimethoxysilane, N-2(aminoethyl)-3-aminopropyltriethoxysilane, 3-aminopropyltrimethoxysilane, 3-aminopropyltriethoxysilane, 3-triethoxysilyl-N-(1,3-dimethylbutylidene)propyl amine, N-phenyl-3-aminopropyltrimethoxysilane, N-phenyl-3-aminopropyltrimethoxysilane, and N-(vinylbenzyl)-2-aminoethyl-3-aminopropyltrimethoxysilane, is formed on the polyimide resin laminate side of the surface-treated layer, and the surface roughness (Rz) of the copper foil is 0.5 to 0.9 μm.

3. A flexible copper clad laminate as set forth in claim 1 or 2,
  wherein the thermoplastic polyimide resin layer has a glass transition temperature of 200 to 330° C., and a thickness of the thermoplastic polyimide resin layer is 1.2 to 2.5 times of the surface roughness (Rz) of the copper foil.

4. A flexible copper clad laminate as set forth in claim 1 or 2,
  wherein the polyimide resin laminate has an initial peel strength of a bonding surface of the copper foil of 0.6 kN/m or more, and a peel strength after an open-air heat test ranging between 80% of the initial peel strength and the initial peel strength.

5. A flexible copper clad laminate as set forth in claim 3,
  wherein the polyimide resin laminate has an initial peel strength of a bonding surface of the copper foil of 0.6 kN/m or more, and a peel strength after an open-air heat test ranging between 80% of the initial peel strength and the initial peel strength.

* * * * *